United States Patent [19]

Iwasaki et al.

[11] Patent Number: 5,818,123
[45] Date of Patent: *Oct. 6, 1998

[54] ELECTRICAL SYSTEM FOR ELECTRICALLY INTERCONNECTING A PARENT SWITCH DEVICE TO A CHILD SWITCH DEVICE

[75] Inventors: Koumei Iwasaki; Toshiro Shinoto; Kazuhiro Makino, all of Osaka, Japan

[73] Assignee: Keyence Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 661,613

[22] Filed: Jun. 11, 1996

[30] Foreign Application Priority Data

Jun. 12, 1995 [JP] Japan ................................. 7-144491
Oct. 2, 1995 [JP] Japan ................................. 7-254853

[51] Int. Cl.$^6$ ...................................................... H02J 4/00
[52] U.S. Cl. ............................... 307/42; 307/32; 307/117; 356/4.01
[58] Field of Search ............................... 307/116, 11, 31, 307/42, 112, 12, 32, 117; 356/4.01; 250/208.2

[56] References Cited

U.S. PATENT DOCUMENTS

| | | |
|---|---|---|
| 4,206,443 | 6/1980 | Britton .................................. 307/147 |
| 4,433,249 | 2/1984 | Long ..................................... 307/31 |
| 5,270,541 | 12/1993 | Matuzaki .............................. 250/239 |
| 5,434,792 | 7/1995 | Saka et al. .......................... 364/468.17 |
| 5,471,050 | 11/1995 | Nishimoto et al. ................. 250/214 A |
| 5,483,464 | 1/1996 | Song ..................................... 364/492 |
| 5,623,531 | 4/1997 | Nilssen .................................. 379/56 |

*Primary Examiner*—Jeffrey A. Gaffin
*Assistant Examiner*—Albert W. Paladini
*Attorney, Agent, or Firm*—Sughrue, Mion, Zinn, Macpeak & Seas, PLLC

[57] ABSTRACT

A system for distributing power from a detection switch parent device to detection switch child, or slave, devices. The system includes a power supply source for supplying an electric power; the detection switch parent device including, a body portion, an output wire for outputting a detection signal connected to the body portion, and power supply wires connectable to the power supply source, for receiving the electric power; at least one detection switch child device each including, a body portion, and an output wire for outputting a detection signal connected to the body portion; and electrical connection means for electrically connecting the body portions of the detection switch parent device to detection switch child device to one another to transmits the electric power being supplied to the body portion of the detection switch parent device to the body portion of the detection switch child device.

22 Claims, 7 Drawing Sheets

ELECTRICAL SYSTEM FOR ELECTRICALLY INTERCONNECTING A PARENT SWITCH DEVICE TO A CHILD SWITCH DEVICE

BACKGROUND OF THE INVENTION

This invention relates to a detection switch system comprising a plurality of sequentially-arranged detection switches.

Detection switches, such as a photoelectric switch, a proximity switch and an ultrasonic switch, have heretofore been used for determining whether an object, moving, for example, in a production line of a factory, is present or absent. For example, the photoelectric switch applies light to a path of travel of the object, and detects whether or not there is light reflected from or transmitted through the object, thereby determining the presence of the object.

For detecting the presence of the object from a plurality of directions or from a plurality of positions, a photoelectric system, including a plurality of photoelectric switches, is used. Detection signals, outputted respectively from the plurality of photoelectric switches, are inputted, for example, into a programmable logic controller. In accordance with the detection signals from the plurality of photoelectric switches, the programmable logic controller controls various control devices in a sequential manner.

FIG. 8 is a view showing a conventional construction in which a plurality of photoelectric switches are connected to a power source and a programmable logic controller through a terminal mount.

As shown in FIG. 8, an output wire L1 for outputting a detection signal representative of detection results, as well as a pair of power supply wires L2 and L3 for supplying electric power, is connected to each of the photoelectric switches 1. The output wire L1 and the power supply wires L2 and L3 from each photoelectric switch 1 are connected respectively to terminals 201, 202 and 203 on the terminal mount 200.

A pair of terminals of the power source 300 are connected respectively to one pair of terminals 202 and 203 on the terminal mount 200. The plurality of terminals 202, as well as the plurality of terminals 203, are connected to one another. A plurality of input terminals of the programmable logic controller 400 are connected respectively to a plurality of terminals 204 of the terminal mount 200. The plurality of terminals 204 are electrically connected respectively to the terminal 201.

Thus, this conventional photoelectric switch system have problems that the wiring for supplying electric power from the power source 300 to the photoelectric switches 1 is complicated, and that with the increase of the number of photoelectric switches 1, the time and labor required for installing the wiring increases.

SUMMARY OF THE INVENTION

It is an object of this invention to provide a detection switch parent device, a detection switch child device and a detection switch system which can simplify the wiring for supplying electric power to the detection switches, and can reduce the time and labor required for installing the wiring.

According to a first aspect of the present invention, there is provided a detection switch system comprising: a power supply source for supplying an electric power; a detection switch parent device including, a body portion, an output wire for outputting a detection signal connected to the body portion, and power supply wires connectable to the power supply source, for receiving the electric power; plural detection switch child devices, each including, a body portion, and an output wire for outputting a detection signal connected to the body portion; and electrical connection means for electrically connecting the body portions of the detection switch parent device to detection switch child device to one another to transmits the electric power being supplied to the body portion of the detection switch parent device to the body portion of the detection switch child device.

According to a second aspect, there is provided the detection switch system according to the first aspect, wherein the electrical connection means comprises a connector which can interconnect the body portions of the adjacent detection switches.

According to a third aspect, there is provided the detection switch system according to the first or second aspect, wherein the body portion of each of the detection switches has fixing means by which the body portion is fixed to the adjacent body portion.

The fixing means may be constituted by a retaining portion provided at one side surface of each of the body portions, and a retaining portion provided at the other side surface of the adjacent body portion.

According to a fourth aspect, there is provided the detection switch device according to the third aspect, wherein the fixing means is provided around the connector.

According to a fifth aspect, there is provided the detection switch device according to the fourth aspect, wherein the connector comprises a first connector mounted on one side surface of each of the body portions, and a second connector mounted on the other side surface of the adjacent body portion, and the fixing means is constituted by an elastic retaining member mounted around the first connector of each of the body portions, and a retaining portion provided around the second connector of the adjacent body portion.

According to a sixth aspect, there is provided a detection switch parent device for electrically connectable to a detection switch child device, comprising: a body portion mechanically and electrically connectable to the detection switch child device; an output wire for outputting a detection signal; power supply wires connected to the body portion, for receiving an electric power; and electrical connection means for transmitting the electric power to the detection switch child device.

According to a seventh aspect, there is provided a detection switch child device for electrically connectable to a detection switch parent device or another detection switch child device, comprising: a body portion mechanically and electrically connectable to the detection switch parent device or another detection switch child device; an output wire for outputting a detection signal; and electrical connection means for transmitting an electric power between the detection switch child device and the detection switch parent device or another detection switch child device thus connected.

In the detection switch systems of the first to fifth aspects, the adjacent detection switch body portions are connected together by the electrical connection means. The electric power, supplied to the body portion of one detection switch, is transmitted sequentially to the body portions of the other detection switches through the electrical connection means. Therefore, there is no need to provide the wiring for supplying the electric power individually to the body portions. Therefore, the wiring is simplified, and the time and labor required for the wiring are reduced.

Particularly in the detection switch system of the second aspect, the body portions of any two adjacent detection switches are interconnected by the connector. Therefore, the body portions of the plurality of detection switches are connected together electrically and mechanically. Therefore, the electrical and mechanical connection between the body portions of the plurality of detection switches can be effected easily.

In the detection switch system of the third aspect, the body portions of the adjacent detection switches are fixed together by the fixing means. Therefore, the body portions of the plurality of detection switches are positively connected to one another.

In the detection switch system of the fourth aspect, the fixing means is provided around the connector, and therefore the connector is positively and effectively protected from an external force.

In the detection switch system of the fifth aspect, the elastic retaining member, mounted around the first connector of each body portion, is engaged with the retaining portion provided around the second connector of the adjacent body portion, thereby fixing the adjacent body portions to each other. Therefore, the body portions of the plurality of detection switches can be easily and positively connected to one another while protecting the connectors.

When the detection switch child device is connected to the detection switch parent device of the sixth aspect, the electric power, supplied to the body portion through the power supply wires, is transmitted to the detection switch child device through the electrical connection means. There is no need to provide any wiring for supplying the electric power to the detection switch child device. Therefore, the wiring is simplified, and the time and labor required for the wiring are reduced.

When the detection switch child device of the seventh is connected to the detection switch parent device, the electric power, supplied to the detection switch parent device, is transmitted to the body portion of the detection switch child device through the electrical connection means. Therefore, there is no need to provide any wiring for supplying the electric power to the detection switch child device. Therefore, the wiring is simplified, and the time and labor required for the wiring are reduced.

DETAILED DESCRIPTION OF THE PREFERRED EMBODIMENTS

Figure 1:
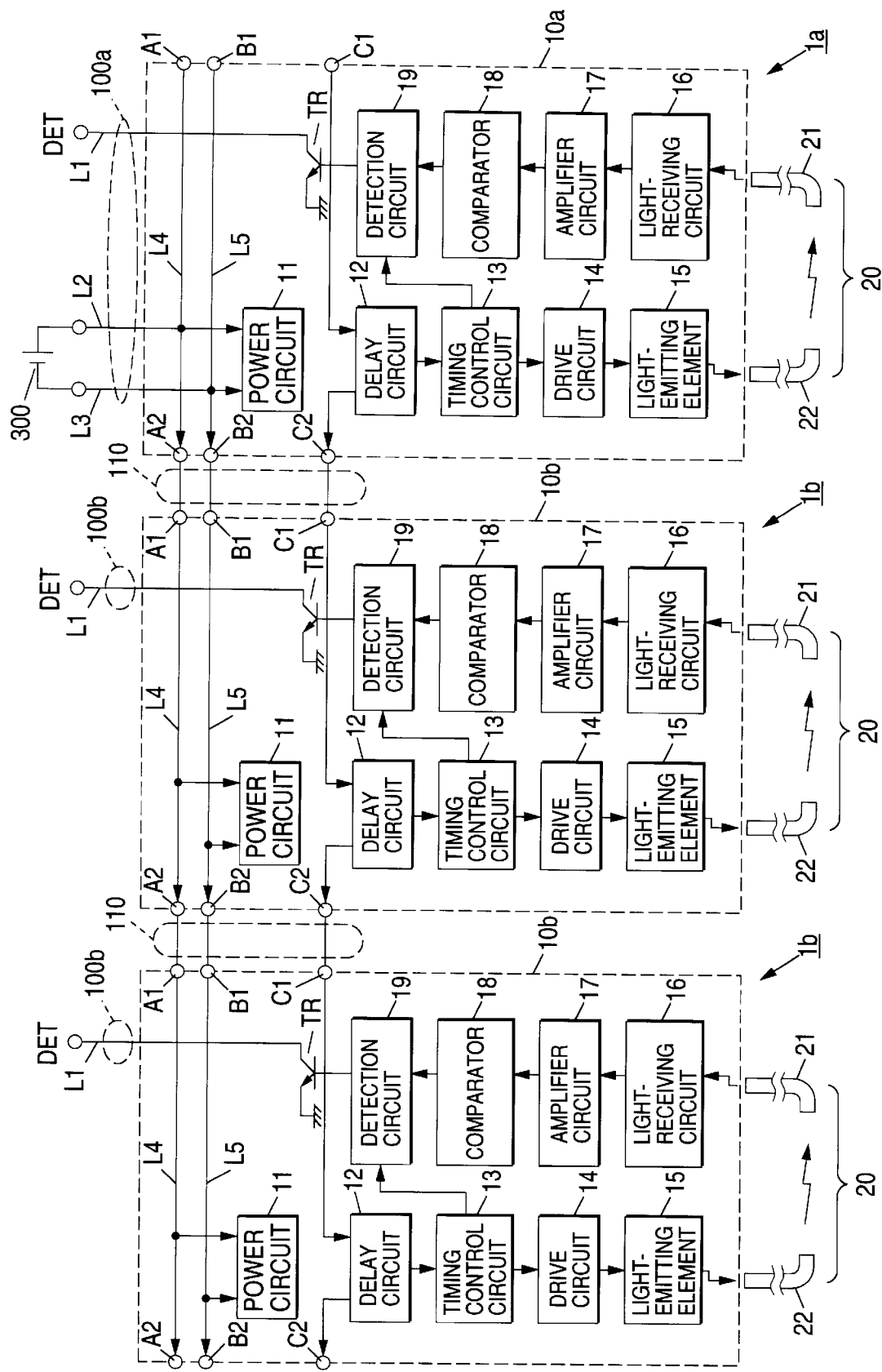
FIG. 1 is a block diagram showing one preferred embodiment of a photoelectric switch system of the present invention.

FIG. 1 is a block diagram showing one preferred embodiment of a photoelectric switch system of the present invention.

In the photoelectric switch system of FIG. 1, one photoelectric switch parent device 1a and a plurality of photoelectric switch child devices 1b are sequentially arranged. The photoelectric switch parent device 1a comprises a parent device body portion 10a and a sensor head portion 20. The photoelectric switch child device 1b comprises a child device body portion 10b and a sensor head portion 20.

The parent device body portion 10a comprises a power circuit 11, a delay circuit 12, a timing control circuit 13, a drive circuit 14, a light-emitting element 15, a light-receiving element 16, an amplifier circuit 17, a comparator 18, a detection circuit 19, and an output transistor TR. The light-emitting element 15 comprises, for example, a light-emitting diode, and the light-receiving element 16 comprises, for example, a photodiode. The sensor head portion 20 comprises a pair of optical fibers 21 and 22.

A cable 100a is connected to the parent device body portion 10a. The cable 100a includes an output wire L1 connected to the output transistor TR, and a pair of power supply wires L2 and L3 connected to the power circuit 11. The power supply wires L2 and L3 are connected to an external power source 300. A power transmission wire L4 is connected between connector pins A1 and A2, and a power transmission wire L5 is connected between connector pins B1 and B2. The power transmission lines L4 and L5 are connected to the power supply wires L2 and L3, respectively. The power circuit 11 supplies electric power to the various parts in the parent device body portion 10a. An input terminal of the delay circuit 12 is connected to a connector pin C1 which receives an external synchronizing signal, and an output terminal of this delay circuit is connected to a connector pin C2.

Each of the child device body portion 10b has the similar construction to that of the parent device body portion 10a except that it is not connected directly to the power source 300. A cable 100b is connected to the child device body portion 10b. The cable 100b includes an output wire L1 connected to an output transistor TR. A power transmission line L4 is connected between connector pins A1 and A2, and a power transmission line L5 is connected between connector pins B1 and B2. These power transmission lines L4 and L5 are connected to a power circuit 11. The power circuit 11 supplies electric power to the various parts in the child device body portion 10b.

The connector pins A2, B2 and C2 of the parent device body portion 10a are connected respectively to the connector pins A1, B1 and C1 of the adjoining child device body portion 10b through a connector portion 110. The connector pins A2, B2 and C2 of each of the child device body portions 10b are connected respectively to the connector pins A1, B1 and C1 of the adjoining child device body portion 10b through a connector portion 110.

With this arrangement, electric power is supplied from the power source 300 to the power circuit 11 of the parent device body portion 10a via the power supply wires L2 and L3, and is also supplied to the power circuit 11 of each of the child device body portions 10b via the power transmission lines L4 and L5 in the parent device body portion 10a, the connector portion (or portions) 110 and the power transmission lines L4 and L5 in the child device body portion (or portions) 10b.

When the external synchronizing signal is applied to the connector pin C1 of the parent device body portion 10a, this external synchronizing signal is delayed by the delay circuit 12, and is applied as an internal synchronizing signal to the timing control circuit 13, and the delayed external synchronizing signal is outputted from the connector pin C2. In response to the internal synchronizing signal from the delay circuit 12, the timing control circuit 13 controls the drive circuit 14 and the detection circuit 19. The light-emitting element 15, when driven by the drive circuit 14, feeds light through the optical fiber 22.

In the case where the sensor head portion 20 is of the transmission type, and when any object is not present at a measurement position, the light, applied from the light-emitting element 16 through the optical fiber 22, is received by the light-receiving element 16 through the optical fiber 21. On the other hand, where the sensor head portion 20 is of the reflective type, and when an object is present at the measurement position, light, reflected from this object, is received by the light-receiving element 16 through the optical fiber 21. An output signal of the light-receiving element 16 is amplified by the amplifier circuit 17, and then is fed to the comparator 18.

The comparator 18 compares the level of the output signal of the amplifier circuit 17 with a predetermined threshold value, and feeds an output signal, corresponding to this comparison result, to the detection circuit 19. In response to the output signal from the comparator 18, the detection circuit 19 drives the output transistor TR. As a result, a detection signal DET representative of the detection result is outputted through the output wire L1.

The operation of each child device body portion 10b is similar to that of the parent device body portion 10a. Since the sequentially-delayed external synchronizing signal is fed to the child device body portions 10b, the timings of feeding of the light from the sensor head portions 20 of the photoelectric switch parent device 1a and the photoelectric switch child devices 1b are different from one another. Therefore, the light beams, fed respectively from the photoelectric switch parent device 1a and the photoelectric switch child devices, are prevented from interfering with one another.

Figure 2:
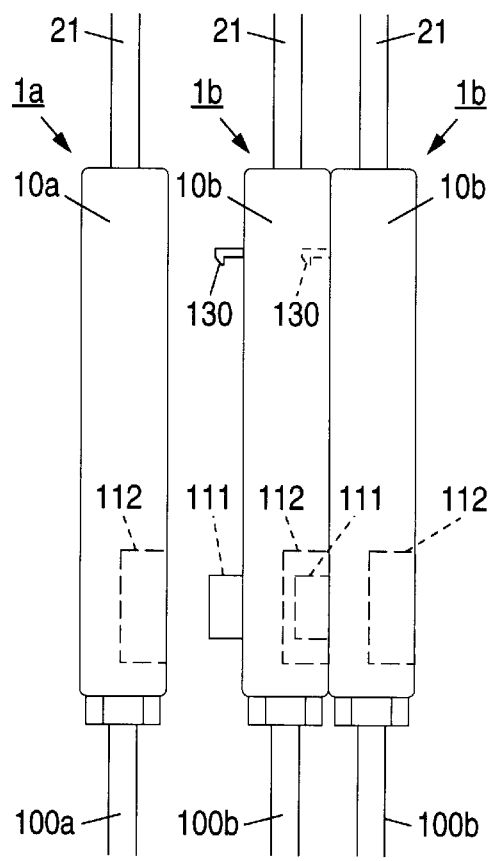
FIGS. 2(a), 2(b) and 2(c) show a plan view, a front-elevational view and a side-elevational view of the photoelectric switch system of FIG. 1.
Figure 2:
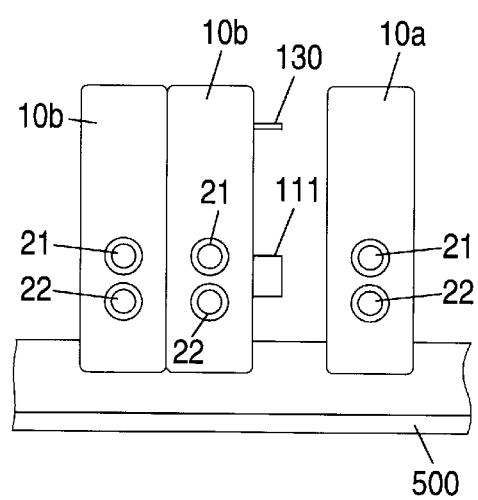
Figure 2:
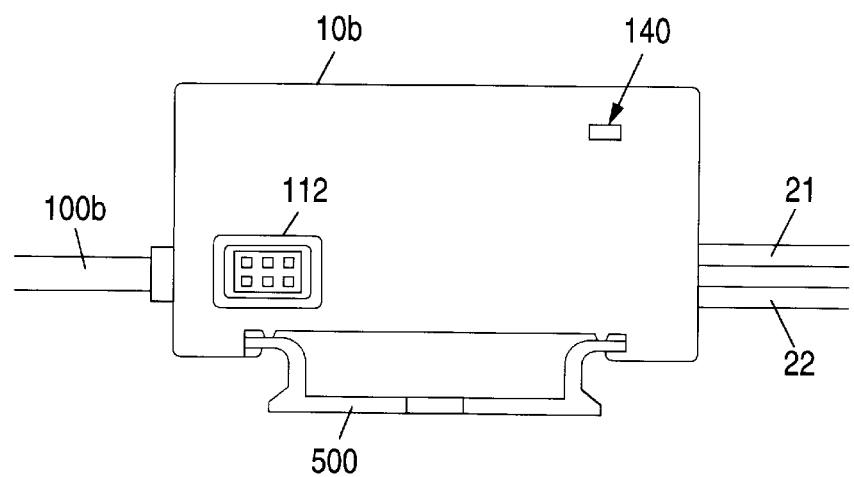

FIGS. 2(a) to 2(c) show the appearance of the photoelectric switch system of FIG. 1, more specifically FIGS. 2(a), 2(b) and 2(c) are a plan view, a front-elevational view and a side-elevational view, respectively.

As shown in FIGS. 2(a) to 2(c), the parent device body portion 10a of the photoelectric switch parent device 1a and the child device body portions 10b of the photoelectric switch child devices 1b can be connected together at their side surfaces. The parent device body portion 10a and the plurality of child device body portions 10b are mounted on a support member 500. The optical fibers 21 and 22 are connected to a front end surface of the parent device body portion 10a, and the cable 100a is connected to a rear end surface thereof. Also, the optical fibers 21 and 22 are connected to a front end surface of each child device body portion 10b, and the cable 100b is connected to a rear end surface thereof.

A female connector 112 is embedded in one side surface of each of the parent device body portion 10a and each child device body portion 10b. A male connector 111 is mounted on the other side surface of each child device body portion 10b. The male connector 111 and the female connector 112 jointly constitute the connector portion 110 shown in FIG. 1. The male connector 111 includes at least the connector pins A1, B1 and C1 shown in FIG. 1. The female connector 112 includes at least the connector pins A2, B2 and C2 shown in FIG. 1.

By connecting the male connector 111 of the child device body portion 10b, disposed adjacent to the parent device body portion 10a, to the female connector 112 of the parent device body portion 10a, the parent device body portion 10a and the child device body portion 10b can be connected together electrically and mechanically. Similarly, by connecting the male connector 111 of each child device body portion 10b to the female connector 112 of the adjoining child device body portion 10b, the adjacent child device body portions 10b can be connected together electrically and mechanically.

A retaining hole 140 (see FIG. 2(c)) is formed on the one side surface of each of the parent device body portion 10a and each child device body portion 10b. A retaining member 130 made of an elastic material is formed on the other side surface of each child device body portion 10b, the retaining member 130 having a pawl at a distal end thereof. The male connector 111 and the retaining member 130 may be mounted on the other side surface of the parent device body portion 10a.

By fitting the retaining member 130 of the child device body portion 10b, disposed adjacent to the parent device body portion 10a, in the retaining hole 140 in the parent device body portion 10a, the parent device body portion 10a and the child device body portion 10b can be mechanically fixed together. Similarly, by fitting the retaining member 130 of each child device body portion 10b in the retaining hole 140 in the adjoining child device body portion 10b, the adjacent child device body portions 10b can be mechanically fixed together.

Figure 3:
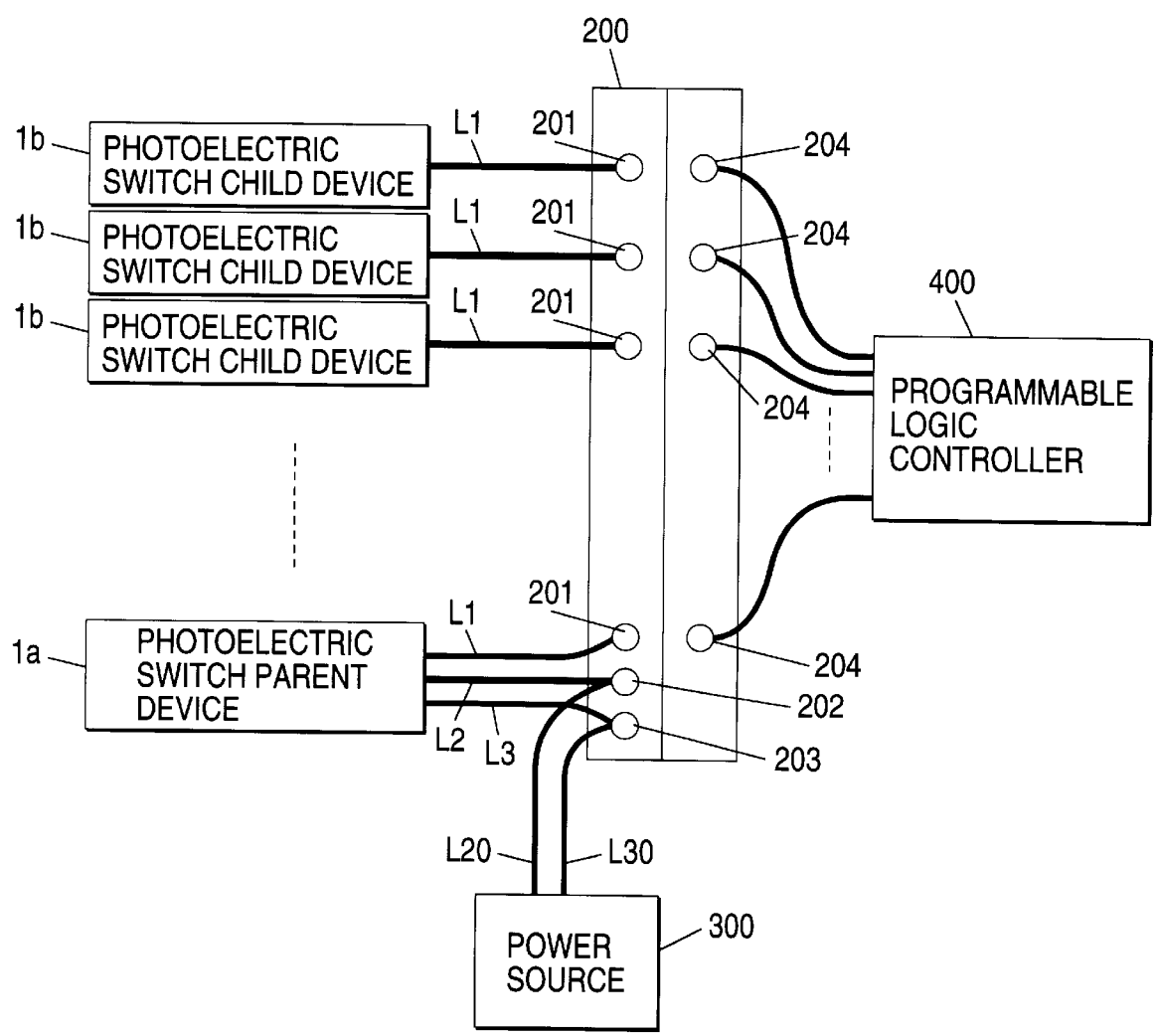
FIG. 3 is a view showing the photoelectric switch system of FIG. 1 connected to a power source and a programmable logic controller through a terminal mount.

FIG. 3 is a view showing the photoelectric switch system of this embodiment connected to the power source and a programmable logic controller through a terminal mount.

As shown in FIG. 3, the output wire L1 of the photoelectric switch parent device 1a and the output wires L1 of the photoelectric switch child devices 1b are connected respectively to corresponding terminals 201 of the terminal mount 200. The pair of power supply wires L2 and L3 of the photoelectric switch parent device 1a are connected respectively to a pair of terminals 202 and 203 of the terminal mount 200.

A pair of power terminals of the power source 300 are connected respectively to the pair of terminals 202 and 203 through respective power wires L20 and L30. A plurality of input terminals of the programmable logic controller 400 are connected respectively to terminals 204 of the terminal mount 200. The terminals 204 are electrically connected to the corresponding terminals 201, respectively.

Thus, in the photoelectric switch system of this embodiment, the pair of power supply wires L2 and L3 of the photoelectric switch parent device 1a are connected respectively to the pair of terminals 202 and 203 of the terminal mount 200, and the power wires L20 and L30 of the power source 300 are connected respectively to the pair of terminals 202 and 203. By doing so, electric power can be supplied to the photoelectric switch parent device 1a and the plurality of photoelectric switch child devices 1b. Therefore, the wiring is simplified, and the time and labor required for installing the wiring are reduced. And besides, even if the number of the photoelectric switch child devices 1b increases, the wiring will not become complicated, and the time and labor for installation of the wiring will not increase.

As shown in FIG. 1, the parent device body portion 10a and each child device body portion 10b have the same construction except that the power supply wires L2 and L3 are connected to the parent device body portion 10a, and therefore the parent device body portion 10a and each child device body portion 10b can be so formed as to have the same dimensions and size. Therefore, the parent device body portion 10a and each child device body portion 10b can be reduced in size, and the time and labor required for the manufacture, as well as the manufacturing cost, can be reduced, and the photoelectric switch system can be easily installed.

The parent device body portion 10a and each child device body portion 10b may have entirely the same construction, in which case the cables 100a and 100b can be selectively attached to and detached from the body portions. In this case, the body portion to which the cable 100a is connected serves as the parent device body portion while those body portions to which the cables 100b are connected, respectively, serve as the child device body portions, respectively.

In the above embodiment, although there are provided the fixing means each constituted by the retaining member 130 and the retaining hole 140, the shape of the fixing means and the fixing method are not limited to this arrangement, and any other suitable mechanical connector may be used.

FIGS. 4(a) to 4(d) are views showing the appearance of a photoelectric switch child device in another embodiment of a photoelectric switch system of the invention, more specifically FIGS. 4(a), 4(b), 4(c) and 4(d) are a front-elevational view, a plan view, a side-elevational view as seen from one side, and a side-elevational view as seen from the other side, respectively.

Figure 4:
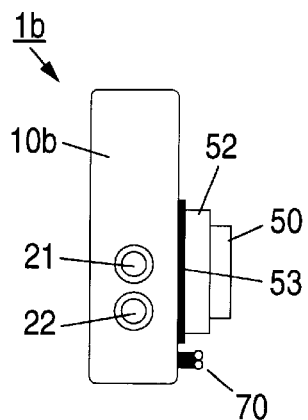
FIGS. 4(a) to 4(d) show a front-elevational view, a plan view, a side-elevational view as seen from one side, and a side-elevational view as seen from the other side of another embodiment of a photoelectric switch system of the invention.

The photoelectric switch child device 1b of FIG. 4 differs from the photoelectric switch child device of FIGS. 2(a) to 2(c) only in fixing means. Therefore, identical parts will be designated respectively by identical reference numerals, and explanation thereof will be omitted.

Figure 4B:
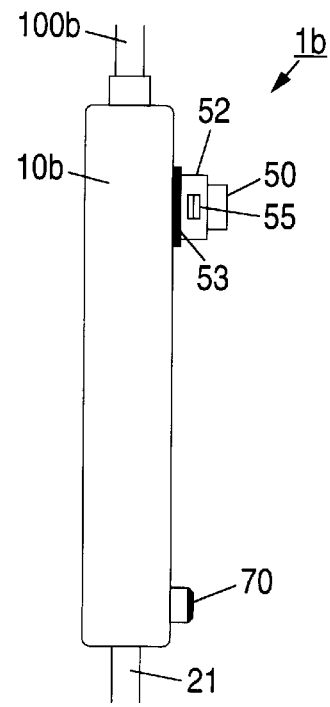
Figure 4:
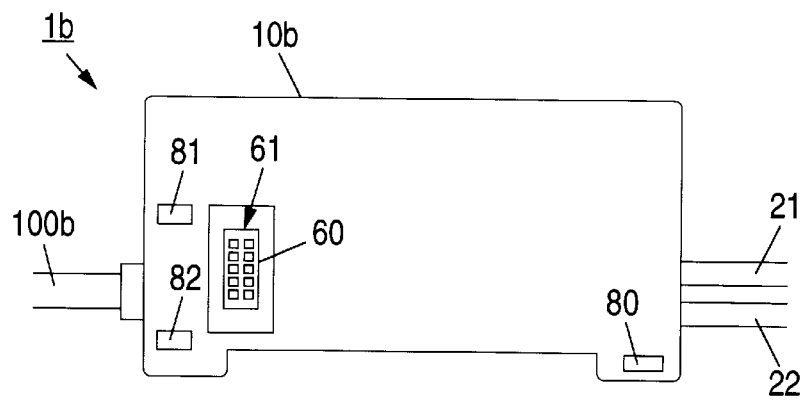
Figure 4:
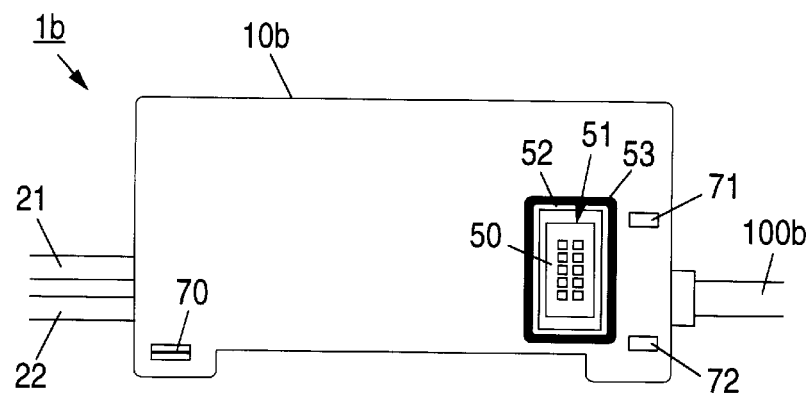

As shown in FIG. 4(c), a retaining hole 61 of a rectangular shape is formed in one side surface of a child device body portion 10b, and a female connector 60 is mounted in the retaining hole 61. As shown in FIG. 4(d), a hole 51 of a rectangular shape is formed in the other side surface of the child device body portion 10b, and a male connector 50 is mounted in the hole 51. As shown in FIGS. 4(a) and 4(b), the male connector 50 projects from the side surface of the child device body portion 10b. The male connector 50 and the female connector 60 jointly constitute a connector portion 110 as shown in FIG. 1. The male connector 50 includes at least connector pins A1, B1 and C1 as shown in FIG. 1. The female connector 60 includes at least connector pins A2, B2 and C2 as shown in FIG. 1.

A tubular retaining member 52 of a rectangular cross-section is mounted in the hole 51 in surrounding relation to the male connector 50. The retaining member 52 is made of an elastic resin such as nylon and polyacetal. A packing (seal member) 54, made of rubber or the like, is mounted at the peripheral edge of the hole 51 around the retaining member 52.

In this embodiment, the retaining member 52 and the retaining hole 61 jointly serve as the fixing means, and the retaining hole 61 defines the portion relative to which the retaining member is fixed.

Further, a retaining hole 80 of a rectangular shape is formed in a predetermined portion of the one side surface of the child device body portion 10b (see FIG. 4(c)), and retaining members 70 each having a pawl at its distal end are formed on that portion of the other side surface corresponding to the retaining hole 80 (see FIGS. 4(a) and 4(d)). Registration holes 81 and 82 of a rectangular shape are formed on the one side surface of the child device body portion 10b (see FIGS. 4(c)), and registration projections 71 and 72 are formed respectively on those portions of the other side surface corresponding respectively to the registration holes 81 and 82 (see FIG. 4(d)).

In the photoelectric switch system of this embodiment, a parent device body portion (not shown) has the same construction as that of the child device body portion 10b except that the male connector 50, the hole 51, the retaining member 52, the packing 53, the retaining member 70 and the registration projections 71 and 72 as shown in FIG. 4(d) are not provided at a side surface thereof. However, the male connector 50, the hole 51, the retaining member 52, the packing 53, the retaining member 70 and the registration projections 71 and 72 may be provided at the other side surface of the parent device body portion as in the child device body portion 10b.

Figure 5:
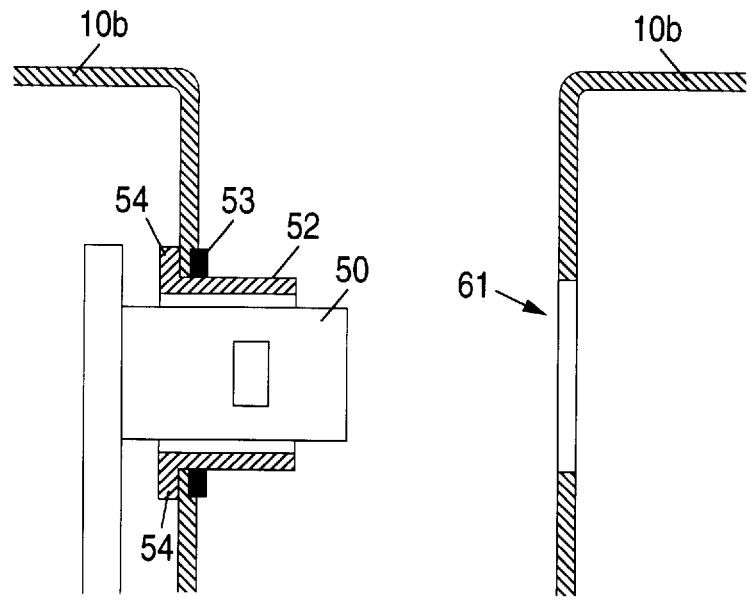
FIGS. 5(a) and 5(b) are cross-sectional views showing that portion of a photoelectric switch child device of FIGS. 4(a) to 4(d), including a connector portion, in detail.
Figure 5:
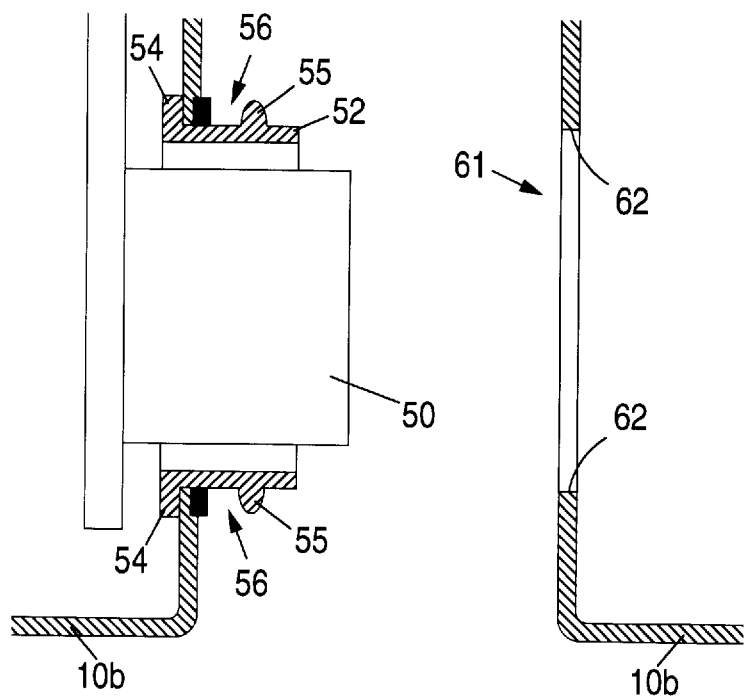
Figure 6:
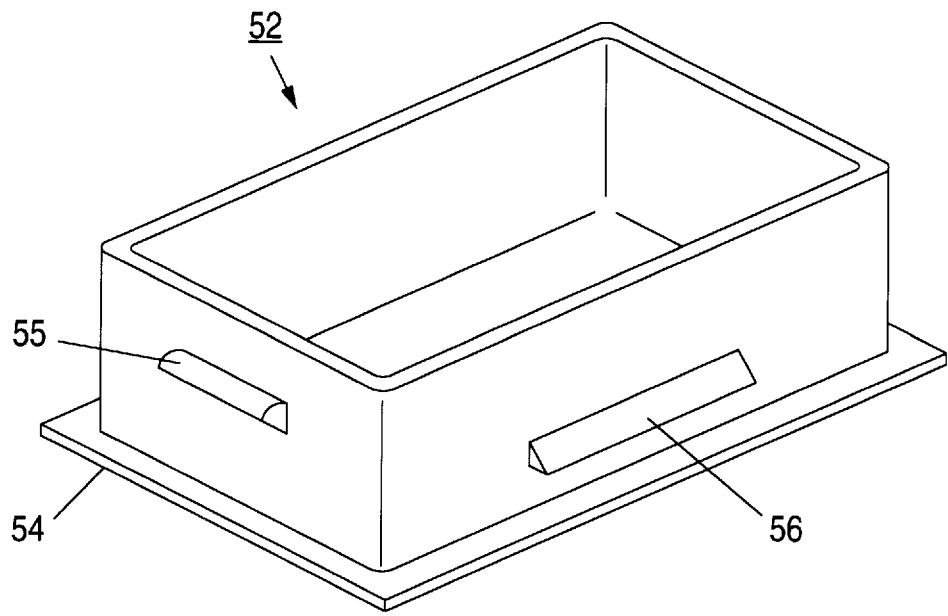
FIG. 6 is a perspective view of a retaining member of the photoelectric switch child device of FIGS. 4(a) to 4(d)
Figure 7:
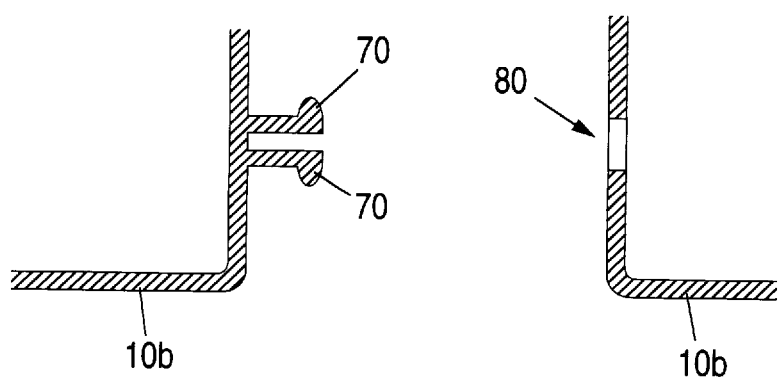
FIG. 7 is a cross-sectional view showing another retaining member of the photoelectric switch child device of FIGS. 4(a) to 4(d) and a retaining hole in detail.
Figure 8:
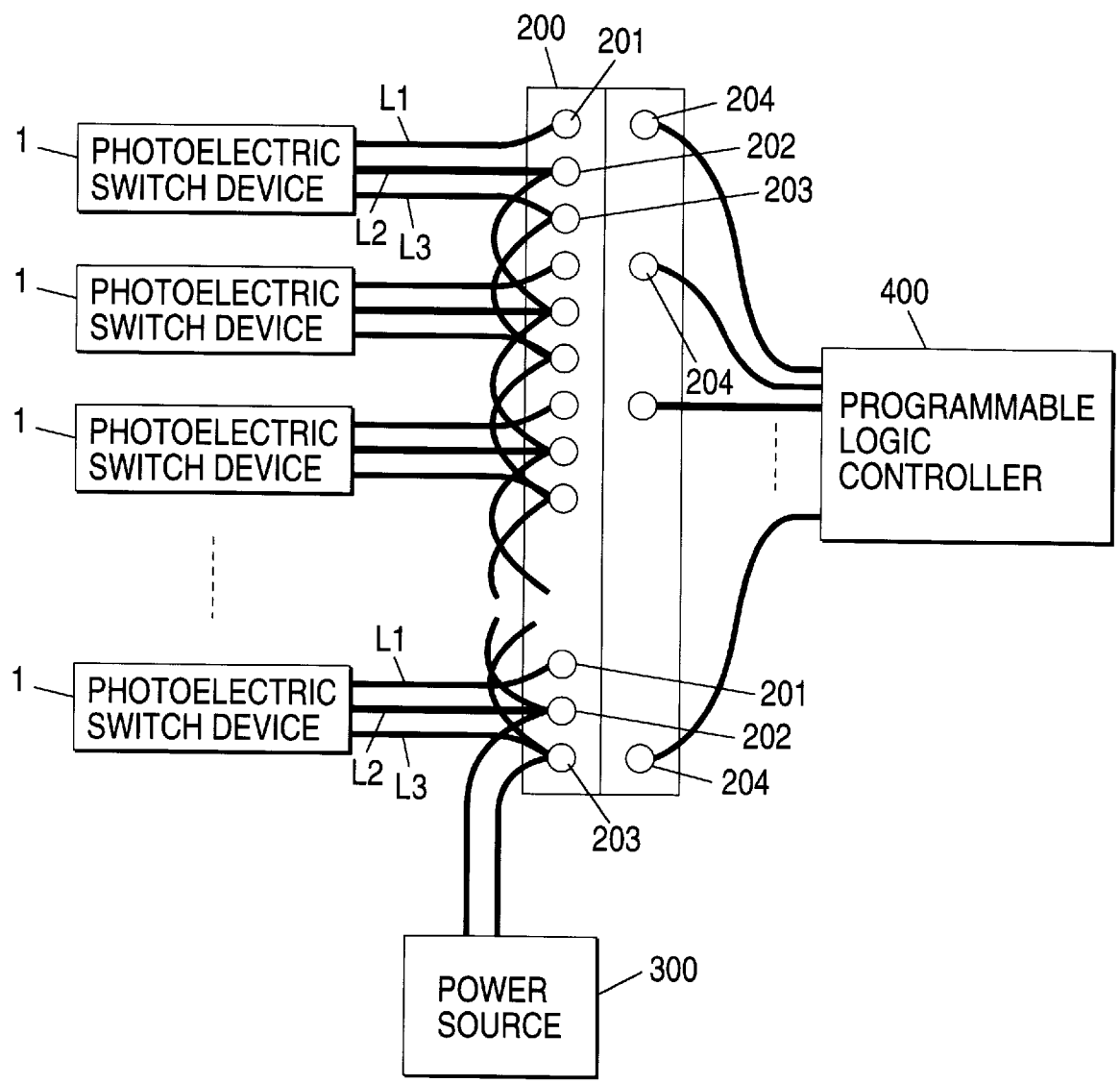
FIG. 8 is a view showing a conventional photoelectric switch system connected to a power source and a programmable logic controller through a terminal mount.

FIG. 5(a) and 5(b) are cross-sectional views showing that portion of the child device body portion 10b, including the connector portion, in detail, more specifically FIG. 5(a) is a cross-sectional view in a direction of the shorter side, and FIG. 5(b) is a cross-sectional view in a direction of the longer side. FIG. 6 is a perspective view of the retaining member 52. FIG. 7 is a cross-sectional view showing the retaining member 70 and the retaining hole 80 in detail.

As shown in FIGS. 5(a), 5(b) and 6, a flange 54 is formed at one peripheral edge of the tubular retaining member 52 of a rectangular cross-section. As shown in FIG. 6, protuberances 56 are formed respectively on the opposite longer side surfaces of the retaining member 52. When the retaining member 52 is fitted into the hole 51 (see FIG. 4(d)), the peripheral edge portion of the hole 51 is held between the flange 54 and the protuberances 56, so that the retaining member 52 is fixed to the peripheral edge portion of the hole 51. The packing 53 is integrally secured to the peripheral edge portion of the hole 51 when the child device body portion 10b is formed. The packing 53 may be formed separately from the child device body portion 10b.

As shown in FIGS. 5(b) and 6, protuberances 55 are formed respectively on the opposite shorter side surfaces of the retaining member 52. When the male connector 50 of the child device body portion 10b is connected to the female connector 60 of the parent device body portion or another child device body portion 10b, the retaining member 52 is fitted in the retaining hole 61 in the parent device body portion or the child device body portion 10b, and also a peripheral edge portion 62 of the retaining hole 61 is engaged in a groove 57 formed between the packing 53 and each protuberance 55 (see FIG. 5(b)). Thus, the peripheral edge portion 62 of the retaining hole 61 is held between the packing 53 and the protuberances 55, so that the side surface of the parent device body portion or another child device body portion 10b is fixed to the retaining member 52.

In this condition, the packing 53 is held in intimate contact with the side surface of the child device body portion 10b and also in intimate contact with the side surface of the parent device body portion or another child device body portion 10b, and therefore the interior of the child device body portion 10 as well as the interior of the parent device body portion or another child device body portion 10b, is kept airtight, thus ensuring a waterproof effect and a dust prevention effect.

When the retaining members 70 of the child device body portion 10b are fitted in the retaining hole 80 in the parent device body portion or another child device body portion 10b (see FIG. 7), the child device body portion 10b is mechanically fixed to the parent device body portion or another child device body portion 10b. At this time, the projections 71 and 72 shown in FIG. 4(d) are fitted respectively in the holes 81 and 82 (see FIGS. 4(c)) in the parent device body portion or another child device body portion. Therefore, the adjacent body portions are positively prevented from being displaced with respect to each other.

In this embodiment, those portions around the connector portion (which is constituted by the male and female connectors 50 and 60) are mechanically fixed together by the fixing means constituted by the retaining member 52 and the retaining hole 61, and therefore the connector portion is positively prevented and effectively protected from an external force. The mechanical fixing is effected not only by the fixing means around the connector portion but also by another fixing means constituted by the retaining members 70 and the retaining hole 80, and therefore the connection between the child device body portion and the parent device body portion, or the connection between the adjacent child device body portions, can be effected positively.

In the above embodiments, although the invention has been applied to the photoelectric switch system, the invention can be applied to any other suitable detection switch system such as a proximity switch system and an ultrasonic switch system.

In the detection switch systems described above, the electric power, supplied to the body portion of one detection switch, is transmitted sequentially to the body portions of the other detection switches through the electrical connection means. Therefore, there is no need to provide the wiring for supplying the electric power individually to the body portions. Therefore, the wiring is simplified, and the time and labor required for the wiring are reduced.

Particularly in the second aspect of the invention, the body portions of any two adjacent detection switches are electrically and mechanically interconnected by the connector, and therefore, the electrical and mechanical connection between the body portions of the plurality of detection switches can be effected easily and positively.

In the third aspect, the body portions of the adjacent detection switches are fixed together by the fixing means, and therefore the body portions of the adjacent detection switches are positively connected together.

In the fourth aspect, the fixing means is provided around the connector, and therefore the connector is positively and effectively protected from an external force.

In the fifth aspect, the fixing means is constituted by the elastic retaining member, mounted around the first connector, and the retaining portion provided around the second connector, and therefore the body portions of the plurality of detection switches can be easily and positively connected to one another while protecting the connectors.

In the sixth aspect, the electric power, supplied to the body portion of the detection switch parent device through the power supply wires, is transmitted to the detection switch child device through the electrical connection means, and therefore there is no need to provide any wiring for supplying the electric power to the detection switch child device. Therefore, the wiring is simplified, and the time and labor required for the wiring are reduced.

In the seventh aspect, the electric power, supplied to the detection switch parent device, is transmitted to the body portion of the detection switch child device through the electrical connection means, and therefore, there is no need to provide any wiring for supplying the electric power to the body portion of the detection switch child device. Therefore, the wiring is simplified, and the time and labor required for the wiring are reduced.

What is claimed is:

1. An electrical system comprising:
   a power supply source for supplying an electric power;
   a detection switch parent device;
   at least one detection switch child device;
   wherein each parent and child device include:
     a body portion, including:
       a photoelectric sensor emitting element for generating a signal,
       a photoelectric receiving circuit for generating an output based on the signal generated by the photoelectric sensor emitting element, and
       a detection circuit for receiving the output from the photoelectric receiving circuit and generating a detection signal, and
     an output wire connected to the body portion for outputting the detection signal
   wherein the body portion of the detection switch parent device further comprises power supply wires connectable to the power supply source, for receiving the electric power; and
   electrical connection means for electrically connecting the body portion of the detection switch parent device to the body portion of the detection switch child device wherein the electric power being supplied to the body portion of the detection switch parent device is supplied to the body portion of the detection switch child device through the body portion of the detection switch parent device, and
   a first input connector for receiving an external synchronizing signal;
   a delay circuit for delaying said external synchronizing signal;
   an output connector for receiving said external synchronizing signal from said delay circuit;
   wherein the body portion of said detection switch child device further comprises a second input connector for receiving said external synchronizing signal from said output connector of said detection switch parent device.

2. The detection switch system according to claim 1, wherein the electrical connection means comprises connectors interconnectable with the body portions of the adjacent detection switches.

3. The detection switch system according to claim 2, wherein the body portion of each of the detection switches has fixing means by which the body portion is fixed to the adjacent body portion.

4. The detection switch system according to claim 3, wherein the fixing means is provided around the respective connectors.

5. The detection switch system according to claim 4, wherein each of the connectors comprises:
   a first connector mounted on one side surface of each of the body portions; and
   a second connector mounted on the other side surface of the adjacent body portion, and
   wherein the fixing means comprises:
     an elastic retaining member mounted around the first connector of each of the body portions; and a retaining portion provided around the second connector of the adjacent body portion.

6. The detection switch system according to claim 1, wherein the body portion of each of the detection switch child and parent devices has fixing means by which the body portion is fixed to the adjacent body portion.

7. The detection switch system according to claim 6, wherein the body portion of each of the detection switch child and parent devices has fixing means by which the body portion is fixed to the adjacent body portion.

8. The detection switch system according to claim 7, wherein the fixing means is provided around the respective connectors.

9. The detection switch system according to claim 8, wherein each of the connectors comprises:
   a first connector mounted on one side surface of each of the body portions; and
   a second connector mounted on the other side surface of the adjacent body portion, and
wherein the fixing means comprises:
   an elastic retaining member mounted around the first connector of each of the body portions; and
   a retaining portion provided around the second connector of the adjacent body portion.

10. A detection switch parent device electrically connectable to a detection switch child device, comprising:
    a body portion, mechanically and electrically connectable to the detection switch child device, including:
      a photoelectric sensor emitting element for generating a signal,
      a photoelectric receiving circuit for generating an output based on the signal generated by the photoelectric sensor emitting element, and
      a detection circuit for receiving the output from the photoelectric receiving circuit and generating a detection signal,
    an output wire connected to the body portion for outputting the detection signal;
    power supply wires connected to the body portion for receiving an electric power; and
    electrical connection means for transmitting the electric power from the body portion to the detection switch child device through the body portion of the detection switch parent device, and
    an electrical connection means for receiving an external synchronization signal;
    a delay means for delaying said external synchronization signal;
    an electrical connection means for receiving said external synchronization signal from said delay means and transmitting external synchronization signal to said detection switch child device.

11. A detection switch child device electrically connectable to a detection switch parent device or another detection switch child device, comprising:
    a body portion, mechanically and electrically connectable to the detection switch parent device or another detection switch child device, including:
      a photoelectric sensor emitting element for generating a signal,
      a photoelectric receiving circuit for generating an output based on the signal generated by the photoelectric sensor emitting element, and
      a detection circuit for receiving the output from the photoelectric receiving circuit and generating a detection signal,
    an output wire connected to the body portion for outputting the detection signal; and
    electrical connection means for transmitting an electric power between the body portion of the detection switch child device and a body portion of the detection switch parent device or another detection switch child device thus connected, and
    electrical connection means for receiving an external synchronization signal from said detection switch parent device.

12. A detection switch system comprising:
    a power supply source for supplying an electric power;
    power supply wires for transmitting the electric power from the power source;
    a detection switch parent device;
    at least two detection switch child devices;
    wherein each parent and child device include:
      a body portion, including:
        a photoelectric sensor emitting element for generating a signal,
        a photoelectric receiving circuit for generating an output based on the signal generated by the photoelectric sensor emitting element,
        a detection circuit for receiving the output from the photoelectric receiving circuit and generating a detection signal,
        an output wire for outputting the detection signal from the detection circuit, and
        power supply lines electrically connecting to the detection circuit;
      wherein the body portion of the detection switch parent device further comprises power supply lines electrically connecting to the power supply wires; and
    electrical connection means for electrically connecting the power supply lines of the detection switch parent device to the respective power supply lines of the adjacent detection switch child device wherein the detection switch parent device and the adjacent detection switch child device are mechanically connected via the electrical connection means, and for electrically connecting power supply lines of the detection switch child device to the respective power supply lines of the adjacent detection switch child device wherein the detection switch child device and the adjacent detection switch child device are mechanically connected via electrical connection means, and
    a first input connector for receiving an external synchronizing signal;
    a delay circuit for delaying said external synchronizing signal;
    an output connector for receiving said external synchronizing signal from said delay circuit;
    wherein the body portion of each detection switch child device further comprises a second input connector for receiving said external synchronizing signal from said output connector of said detection switch parent device.

13. The detection switch system according to claim 12, wherein the electrical connection means comprises connectors.

14. The detection switch system according to claim 13, wherein the body portion of each of the detection switch child and parent devices has fixing means by which the body portion is fixed to the adjacent body portion.

15. The detection switch system according to claim 14, wherein the fixing means is provided around the respective connectors.

16. The detection switch system according to claim 15, wherein each the connector comprises:
   a first connector mounted on one side surface of each of the body portions; and
   a second connector mounted on the other side surface of the adjacent body portion, and
wherein the fixing means comprises:
   an elastic retaining member mounted around the first connector of each of the body portions; and
   a retaining portion provided around the second connector of the adjacent body portion.

17. A detection switch parent device in which an electrical power from a power supply source is received via power supply lines, comprising:
   a body portion, including:
      a photoelectric sensor emitting element for generating a signal,
      a photoelectric receiving circuit generating an output based on the signal generated by the photoelectric sensor emitting element,
      a detection circuit for receiving the output from the photoelectric receiving circuit and generating a detection signal, and
      power supply lines electrically connecting to the power supply wires and the detection circuit;
   an output wire connected to the body portion for outputting the detection signal, and
   an input connector for receiving an external synchronizing signal;
   a delay circuit for delaying said external synchronizing signal;
   an output connector for receiving said external synchronizing signal from said delay circuit and outputting said external synchronizing signal.

18. The detection switch parent device according to claim 17, further comprising:
   a connector for electrically and mechanically connecting the power supply lines thereof to the respective power supply lines of an adjacent detection switch child device.

19. A detection switch child device for attaching another detection switch child device or a detection switch parent device, comprising:
   a body portion, including:
      a photoelectric sensor emitting element for generating a signal,
      a photoelectric receiving circuit for generating an output based on the signal generated by the photoelectric sensor emitting element,
      a detection circuit for receiving the output from the photoelectric receiving circuit and generating a detection signal, and
      power supply lines electrically connecting to the detection circuit;
   an output wire connected to the body portion for outputting the detection signal, and
   an electrical connector for receiving an external synchronization signal from said detection switch parent device.

20. The detection switch parent device according to claim 19, further comprising:
   a connector for electrically and mechanically connecting the power supply lines thereof to the respective power supply lines of the adjacent detection switch child device or the adjacent detection switch parent device.

21. An electrical system comprising:
   a power supply source for supplying an electric power;
   a detection switch parent device including,
      a body portion,
      an output wire for outputting a detection signal connected to the body portion, and
      power supply wires connectable to the power supply source, for receiving the electric power;
   a first input connector for receiving an external synchronizing signal;
   a delay circuit for delaying said external synchronizing signal;
   an output connector for receiving said external synchronizing signal from said delay circuit;
   at least one detection switch child device, including,
      a body portion, and
      an output wire for outputting a detection signal connected to the body portion; and
   electrical connection means for electrically connecting the body portion of the detection switch parent device to the detection switch child device body portion wherein the electric power being supplied to the body portion of the detection switch parent device is supplied to the body portion of the detection switch child device through the body portion of the parent device, and
wherein the body portion of each of said at least one detection switch child device further comprises a second input connector for receiving said external synchronizing signal from said output connector of said detection switch parent device.

22. The electrical system of claim 21 wherein the body portion of each parent and child device includes a detection circuit for generating a detection signal.

* * * * *